(12) United States Patent
Lerner et al.

(10) Patent No.: US 11,637,004 B2
(45) Date of Patent: Apr. 25, 2023

(54) ALIGNMENT MODULE WITH A CLEANING CHAMBER

(71) Applicant: Applied Materials, Inc., Santa Clara, CA (US)

(72) Inventors: Alexander N. Lerner, San Jose, CA (US); Michael P. Karazim, San Jose, CA (US); Andrew J. Constant, Cupertino, CA (US); Jeffrey A. Brodine, Los Gatos, CA (US); Kim Ramkumar Vellore, San Jose, CA (US); Kevin Moraes, Mountain View, CA (US); Roey Shaviv, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 329 days.

(21) Appl. No.: 16/848,614

(22) Filed: Apr. 14, 2020

(65) Prior Publication Data

US 2020/0373134 A1 Nov. 26, 2020

Related U.S. Application Data

(60) Provisional application No. 62/852,734, filed on May 24, 2019.

(51) Int. Cl.
*H01L 21/67* (2006.01)
*H01J 37/32* (2006.01)
(Continued)

(52) U.S. Cl.
CPC ...... *H01J 37/32853* (2013.01); *C23C 16/042* (2013.01); *H01L 21/6773* (2013.01); *H01L 21/67359* (2013.01); *H01L 21/68* (2013.01)

(58) Field of Classification Search
CPC ............. H01J 37/32853; C23C 16/042; H01L 21/67359; H01L 21/6773; H01L 21/68;
(Continued)

(56) References Cited

U.S. PATENT DOCUMENTS

| 2009/0075411 A1* | 3/2009 | Yamazaki | ............. C23C 14/568 |
| | | | 257/E21.001 |
| 2012/0237682 A1* | 9/2012 | Hong | ..................... C23C 14/042 |
| | | | 118/712 |

(Continued)

FOREIGN PATENT DOCUMENTS

| KR | 101502858 B1 | 3/2015 |
| KR | 20160101263 A | 8/2016 |
| KR | 101968960 B1 | 4/2019 |

OTHER PUBLICATIONS

International Search Report and Written Opinion Application No. PCT/US2020/028042 dated Jul. 29, 2020 consists of 12 pages.

*Primary Examiner* — Mohammed Shamsuzzaman
(74) *Attorney, Agent, or Firm* — Patterson + Sheridan, LLP

(57) ABSTRACT

An alignment module for housing and cleaning masks. The alignment module comprises a mask stocker, a cleaning chamber, an alignment chamber, an alignment stage a transfer robot. The mask stocker is configured to house a mask cassette configured to store a plurality of masks. The cleaning chamber is configured to clean the plurality of masks by providing one or more cleaning gases into a chamber after a mask is inserted into the cleaning chamber. The alignment stage is configured to support a carrier and a substrate. The transfer robot is configured to transfer a mask from one or more of the alignment stage and the mask stocker to the cleaning chamber.

18 Claims, 10 Drawing Sheets

(51) Int. Cl.
*C23C 16/04* (2006.01)
*H01L 21/673* (2006.01)
*H01L 21/677* (2006.01)
*H01L 21/68* (2006.01)

(58) Field of Classification Search
CPC ........... H01L 21/6719; H01L 21/67769; H01L 21/682
See application file for complete search history.

(56) References Cited

U.S. PATENT DOCUMENTS

2016/0258050 A1* 9/2016 Lee .................... C23C 14/56
2020/0373183 A1* 11/2020 Lerner .............. H01L 21/67184

* cited by examiner

ALIGNMENT MODULE WITH A CLEANING CHAMBER

This application claims priority to U.S. Provisional Patent Application 62/852,734, filed on May 24, 2019, the disclosure of which is incorporated herein by reference in its entirety.

BACKGROUND

Field

Embodiments of the present disclosure generally relate to apparatus and methods for maintaining masks utilized during material deposition.

Description of the Related Art

Generating a semiconductor device typically comprises depositing multiple layers of different materials on a substrate (or wafer). In many instances, the layers are deposited through a blanket deposition over the entire substrate. The substrate may then be patterned by a lithography (or similar) process. Further, any extra material may be subsequently removed by an etch process or any other suitable material removal process. However, etching various films, for example organic films, is difficult and time intensive. Further, the process of depositing one or more layers is time intensive and the patterning processes, such as lithography, are expensive. Contrary to the above described processes, in various instances, a mask may be positioned over a substrate during the deposition process, controlling which areas of the substrate receive the deposited material, reducing the number of process steps. For example, using a mask during the deposition process may make expensive process steps, such as lithography and etching, unnecessary. However, as the placement of the mask relative to the substrate controls which areas of the substrate receive the deposited material, it is important that the placement of the mask is done with high accuracy. Further, if there is more than one layer deposited through the masks, accurate alignment is even more important. Additionally, overtime, material is deposited on the masks and the masks require cleaning. However, handling of the masks for cleaning may lead to the masks being damaged.

Thus, there is a need for an alignment module that is able to both house, position and clean masks utilized for substrate processing.

SUMMARY

In one embodiment, an alignment module comprises a mask stocker, a cleaning chamber, an alignment chamber, an alignment stage, and a transfer robot. The mask stocker is configured to house a mask cassette configured to store a plurality of masks. The cleaning chamber is configured to clean the plurality of masks. The alignment stage is configured to support a carrier and a substrate. The transfer robot is configured to transfer a mask from one or more of the alignment stage and the mask stocker to the cleaning chamber.

In one embodiment, a method for cleaning a mask comprises transferring a mask from one of a mask stocker of an alignment module and an alignment stage of the alignment module to a cleaning chamber of the alignment module, providing one or more cleaning gases into a chamber body of the cleaning chamber, evacuating the cleaning gases from the chamber body, and transferring the mask from the cleaning chamber to one of the alignment stage and the mask stocker.

In one embodiment, an integrated platform for processing a substrate comprises a transfer chamber, a factory interface, and a plurality of processing chambers and an alignment module. The transfer chamber comprises a substrate transfer robot. The factory interface comprises a substrate carrier chamber configured to receive a substrate and chuck the substrate to a carrier, and a factory interface transfer robot configured to transfer the substrate and the carrier from the factory interface to the transfer chamber. The alignment module comprises a mask stocker, a cleaning chamber, an alignment stage and a transfer robot. The mask stocker is configured to house a mask cassette configured to store a plurality of masks. The cleaning chamber is configured to clean a first mask of the plurality of masks. The alignment stage is configured to support the carrier and the substrate. The transfer robot is configured to transfer the first mask from one or more of the alignment stage and the mask stocker to the cleaning chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
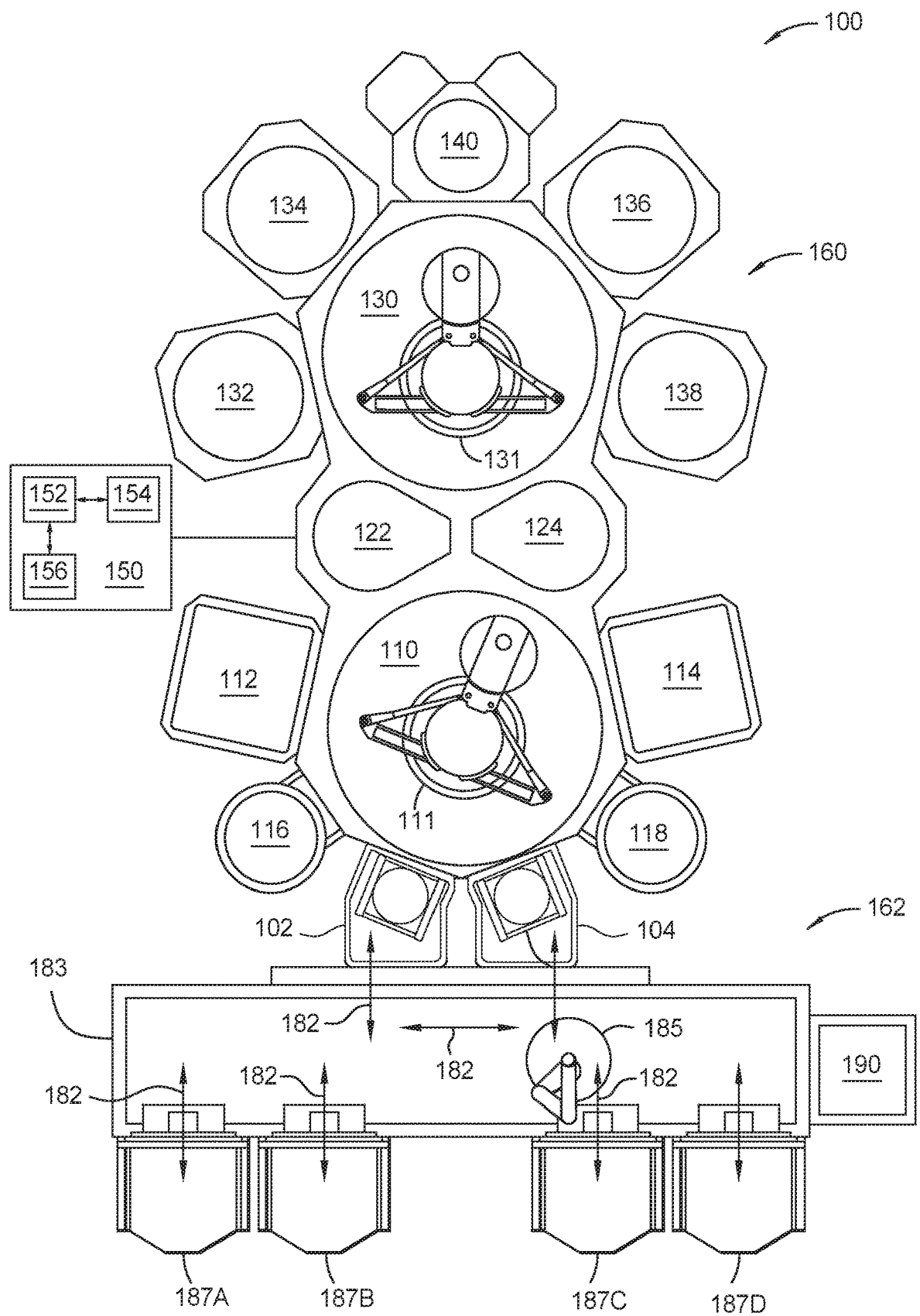
FIG. 1 is a schematic illustration of an integrated platform, according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Masks are commonly used during the processing of a substrate to control at least one of the alignment and placement of a deposited material on the surface of the substrate and etching material from a surface of a substrate. For example, a mask may be positioned over a substrate to control which areas of the surface of the substrate will receive a deposited material. Further, multiple layers of different materials may be deposited onto each substrate to generate an electronic device, with each layer utilizing a different mask. Thus, any misalignment between any of the masks and the substrate in different deposition processes or etching processes may render the corresponding electronic device unusable. Further, during the deposition process, material is deposited on the masks. Overtime, the material deposited on the masks may reduce the ability for the mask to function properly during the deposition process. In the following disclosure, an improved mask alignment chamber that both houses and cleans masks is described. While the disclosure herein primarily discusses the use of the a mask in a deposition process this configuration is not intended to be limiting as to the scope of the disclosure provided herein since the apparatus and methods described herein could also be used for other substrate processing steps, such as etching steps, material doping or implant steps, thermal processing steps or other useful processing steps.

FIG. 1 illustrates an integrated platform 100 for processing a substrate, according to one or more embodiments. For example, the integrated platform 100 may deposit one or more metal layers and/or organic materials on a substrate to fabricate a light sensing device. For example, the light sensing device may be an organic image sensing device. An example of an integrated platform including multiple processing chambers includes the ENDURA® platform, commercially available from Applied Materials, Inc. of Santa Clara, Calif. Alternatively, other substrate processing platforms may be also be modified in accordance with the present disclosure.

The integrated platform 100 may include a vacuum-tight processing platform 160, a factory interface 162, and a controller 150. Further, the integrated platform 100 may also be referred to as a cluster tool or multi-chamber processing system.

The processing platform 160 includes one or more process chambers. For example, the processing platform 160 may include process chambers 112, 114, 116, 118, 132, 134, 138, 136, and 140. Further, the processing platform 160 includes one or more transfer chambers. For example, as is illustrated in FIG. 1, the processing platform 160 includes transfer chambers and 110 and 130. The processing platform 160 may also include one or more pass through chambers that allow a substrate to be transferred between transfer chambers. For example, the pass through chambers 122, 124 may allow a substrate to be transferred between the transfer chambers 110 and 130.

The processing platform 160 may also include one or more load lock chambers. For example, as is illustrated in FIG. 1, the processing platform 160 includes load lock chambers 102, 104. The load lock chambers 102, 104 may be pumped down to be operated under a vacuum before transferring substrates from the factory interface 162 and the transfer chamber 110.

The factory interface 162 includes one or more docking stations 183, one or more factory interface robots 185, and a substrate carrier chamber 190. The docking stations 183 include one or more front opening unified pods (FOUPS) 187A-187D. The factory interface robot 185 may be capable of linear and rotational movement illustrated by arrows 182. Further, the factory interface robot 185 may transfer substrates between the FOUPS 187, the load lock chambers 102, 104 and the substrate carrier chamber 190. The substrate carrier chamber 190 may be configured to mount the substrate on a carrier (e.g., a chuck) or remove the substrate from the carrier. For example, a carrier may include one or more conductive elements (e.g., chucking electrodes) configured to electrostatically hold the substrate against the carrier. The carrier and substrate may be transferred by the factory interface robot 185 from the substrate carrier chamber 190 to one or more of the load lock chambers 102, 104. Additionally, the carrier and a processed substrate may be transferred from the load lock chambers 102, 104 to the substrate carrier chamber 190 such that the processed substrate may be removed from the carrier, and the processed substrate may be transferred from the substrate carrier chamber 190 to one of the FOUPS 187 by the factory interface robot 185.

The transfer chamber 110 includes a transfer robot 111. The transfer robot 111 transfers substrates to and from the load lock chambers 102, 104, to and from the process chambers 112, 114, 116, and 118, and to and from pass through chambers 122, 124. The pass-through chambers 122 and 124 may be utilized to maintain vacuum conditions while allowing substrates to be transferred within the integrated platform 100 between transfer chambers 110 and 130. The transfer robot 131 transfers substrates between the pass-through chambers 122, 124 and the process chambers 132, 134, 136, 138, and 140, and between the process chambers 132, 134, 136, 138, and 140.

The process chambers 112, 114, 116, 118, 132, 134, 138, 136, and 140 may be configured in any manner suitable to process a substrate. For example, the process chambers 112, 114, 116, 118, 132, 134, 138, 136, and 140 may be configured to deposit one or more metal layers, one or more organic films and apply one or more cleaning processes to a substrate to create a semiconductor device such as a light sensing device, or the like.

A first one or more of the process chambers, e.g., the process chambers 116, 118, are configured to perform a pre-cleaning process to eliminate contaminants and/or degas volatile components from a substrate prior to transferring the substrate into another process chamber. The process chambers 114 and 112 may be configured to deposit one or more metal layers on a substrate. The process chamber 138 may be configured to deposit one or more layers of indium tin oxide (ITO) material on a substrate. The process chambers 132, 134 and 136 may be configured to deposit one or more organic films on a substrate. Further, the alignment module 140 may be configured to position a mask (e.g., a shadow mask) on a substrate before the substrate is transferred to one or more the process chambers 132, 134, 136 and 138 and unload a mask from a substrate after processing within one or more of the process chambers 132, 134, 136, and 138. The process chambers 116, 118, 132, 134, 138, 136, and 140 may be configured to deposit materials (e.g., metal layers or organic films) using a chemical deposition process such as chemical vapor deposition (CVD), atomic layer deposition (ALD), metalorganic chemical vapor deposition (MOCVD), plasma-enhanced chemical vapor deposition (PECVD), and physical vapor deposition (PVD) (e.g., sputtering process or evaporation process), among others.

The controller 150 is configured to control the components of the integrated platform 100. The controller 150 may be any suitable controller for controlling the operation one or more of the process chambers, the transfer chambers, pass through chambers, and the factory interface. For example, the controller 150 may be configured to control the operation of transfer robot 111 and/or the transfer robot 131. The controller 150 includes a central processing unit (CPU) 152, a memory 154, and support circuits 156. The CPU 152 may be any general purpose computer processor that may be utilized in an industrial environment. The support circuits 156 are coupled to the CPU 152 and may include cache, clock circuits, input/output subsystems, power supplies and the like. Software routines may be stored within the memory 154. The software routines may be executed by the CPU 152 and thus be adapted to cause various components within the integrated platform 100 to perform one or more of the methods described herein. Alternatively, or additionally, one or more of the software routines may be executed by a second CPU not illustrated. The second CPU may be part of the controller 150 or remote from the controller 150.

One or more process chambers, one or more transfer chambers, one or more pass through chambers, and/or the factory interface may have a dedicated controller or controllers (e.g., the controller 270 of FIG. 2) configured to control at least a portion of the methods disclosed herein. The dedicated controllers may be configured similar to as the controller 150 and may be coupled with the controller 150 to synchronize processing of a substrate within the integrated platform 100.

Figure 2:
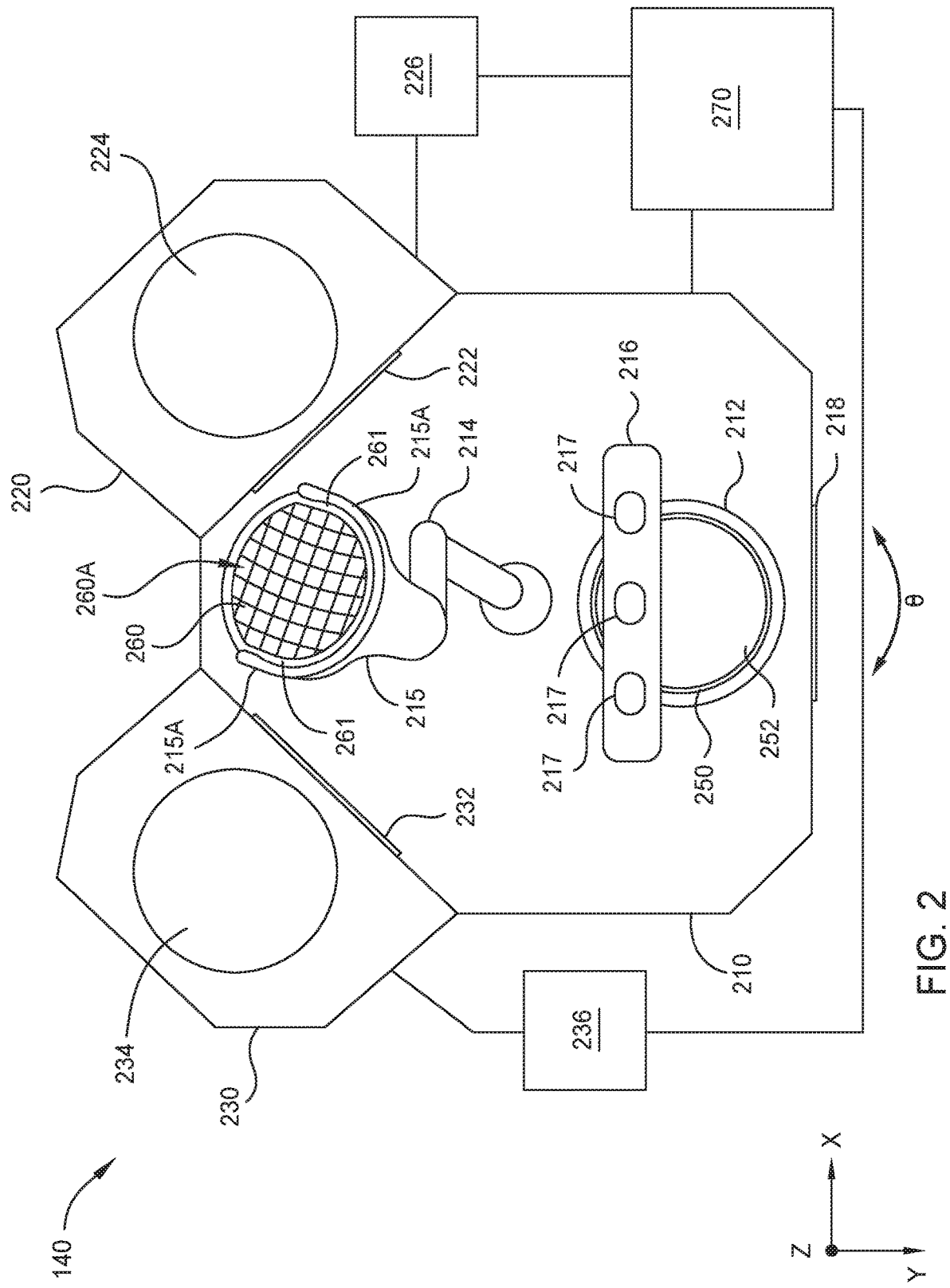
FIG. 2 is a schematic illustration of an alignment module, according to one or more embodiments.

FIG. 2 is a schematic illustration of the alignment module 140, according to one or more embodiments. The alignment module 140 may include an alignment chamber 210 and a mask stocker 220. Additionally, the alignment module 140 may include a second mask stocker, e.g., the mask stocker 230.

Additionally, the alignment chamber 210 may include an alignment stage 212, a transfer robot 214, an alignment system 216, and a valve assembly 218. The valve assembly 218 may be configured to isolate the interior volume of the alignment module 140 from a transfer chamber, e.g., the transfer chamber 130, of the processing platform 160. The valve assembly 218 may include a conventional slit valve or gate valve that is configured to isolate one region or volume from another by opening, closing or obstructing a port or passageway formed between the adjoining regions or volumes. Additionally, the valve assembly 218 may be configured to allow a carrier 250 carrying (or supporting) a substrate 252 to be transferred into and out of the alignment module 140. The valve assembly 218 may be any valve assembly used to separate, or isolate, the alignment module 140 from the processing platform 160. Further, the valve assembly 218 may aid in limiting or eliminating cross-talk and cross contamination between the alignment module 140 and the processing platform 160 each time a substrate is loaded into or transferred out of the alignment module 140. Additionally, the valve assembly 218 opens to allow movement of the transfer robot 131,111 and a substrate and carrier into and out of the alignment module 140. Further, the pressure within the transfer chamber 130 may be little higher than that of the alignment module 140 or any other process chamber. The difference in pressure may protect the buffer from flow influx.

The alignment stage 212 is configured to hold the carrier 250 and substrate 252 while a mask, e.g., mask 260, is positioned over the substrate 252 or removed from the substrate 252. The alignment stage 212 may move in one or more of an X, Y, Z, and θ directions to position and align the substrate 252 with the mask 260.

The mask 260 may be positioned over the substrate 252 such that there is a uniform distance between the mask 260 and the substrate 252 across the surface of the substrate 252. The mask 260 may rest on one or more flexure elements disposed within or on the carrier 250, or within or on a surface of the mask 260. The flexure elements may deform under the weight of the mask 260 and restrict lateral movement of the mask 260.

The masks 260 may have a plurality of openings 260A, each having a diameter in a range of about 3 μm to about 5 μm, or having a rectangular open area that has a width between about 3 μm and about 5 μm and a height between about 3 μm and about 5 μm. Alternatively, the mask 260 may have one or more openings that have a feature dimension (e.g., width, height, and/or diameter) that is less than 3 μm or greater than 5 μm. Further, the masks 260 may have a thickness over the surface of a substrate of between about 1 μm and about 35 μm. The edges of the mask (i.e., region outside of the diameter of a substrate) may have a thickness that is between about 1 μm and about 35 μm. Alternatively, the masks 260 having a thickness of less than about 1 μm or greater than about 35 μm thick may be utilized. The masks 260 may be formed from an invariable material, e.g., invar. For example, the masks 260 may be formed from nickel, or the like. Further, a diameter of the masks is larger than the diameter of the substrates. Additionally, the diameter of the masks may be larger than the diameter of the carriers.

Figure 3:
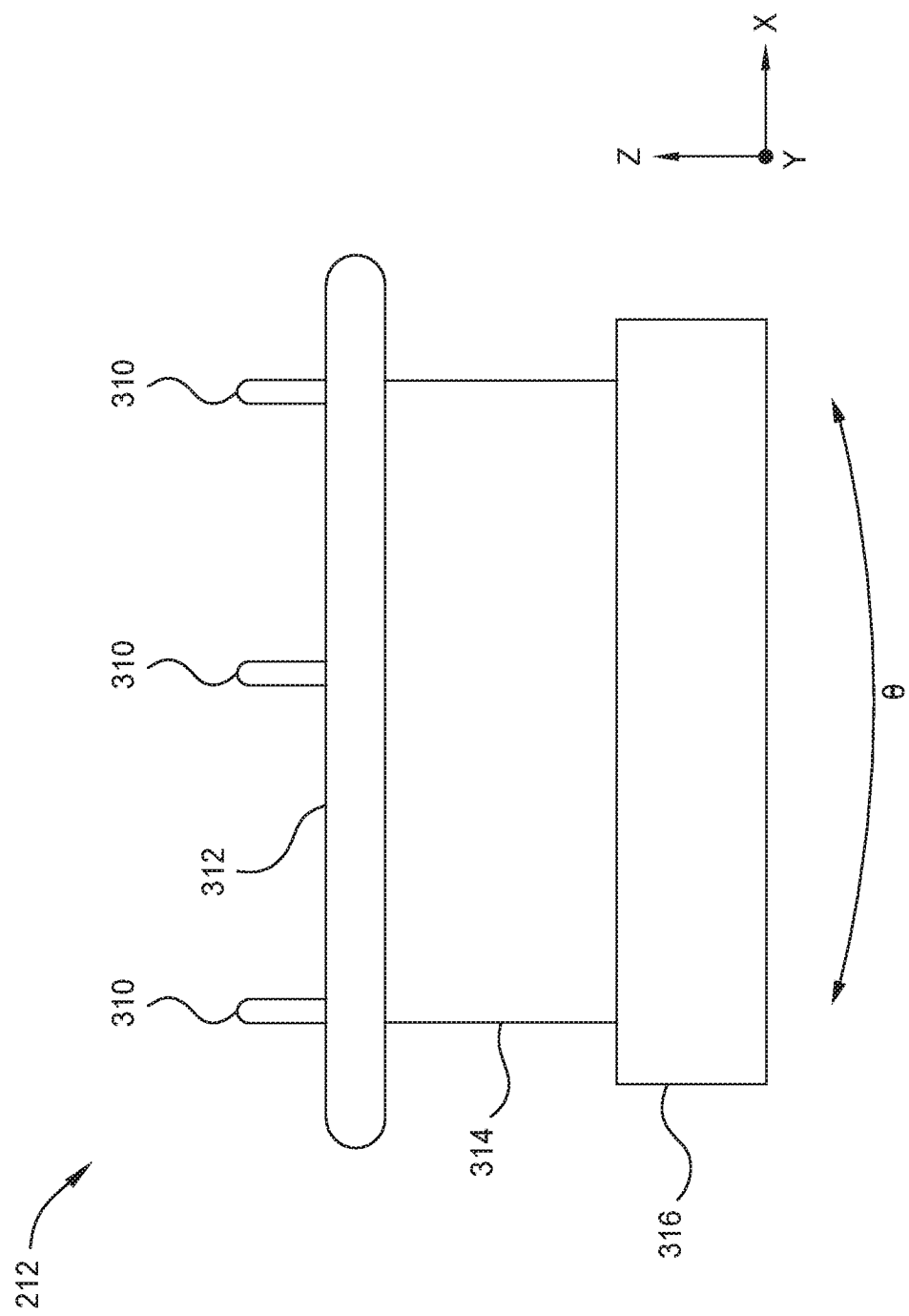
FIG. 3 is a schematic illustration of an alignment stage, according to one or more embodiments.

FIG. 3 is a schematic illustration of a cross-section of the alignment stage 212, according to one or more embodiments. The alignment stage 212 includes loading pins 310, an alignment surface 312, an alignment mechanism 314, and a base 316.

The loading pins 310 are configured to guide and align the carrier 250 onto the alignment stage 212 and aid in the removal of the carrier 250 from the alignment stage 212. For example, the carrier 250 carrying the substrate 252 may be loaded onto the loading pins 310, and the loading pins 310 may be retracted such that the carrier 250 is moved toward to the alignment surface 312. Additionally, the loading pins 310 may be retracted until the carrier 250 contacts and rests on the alignment surface 312.

The alignment mechanism 314 may include one or more actuators configured to move the alignment surface 312 in one or more of an X, Y, Z, and direction. For example, the alignment mechanism 314 may be configured to move the alignment surface 312 at least about 1 mm in the Y, or Z direction to align the carrier 250 and the substrate 252 with the mask 260. Further, the alignment mechanism 314 may move the alignment surface 312 at least about 2 degrees of rotation in the θ direction. The alignment mechanism 314 may move the alignment surface in the Z direction to at least one of bring the substrate 252 into the field of focus (e.g., close to the mask) of the alignment system 216 and move the carrier 250 and substrate 252 to receive the mask 261 from the transfer robot 214. Alternatively, the loading pins 310 may be utilized to move the carrier 250 and substrate 252 in the Z direction (e.g., vertical direction) to receive the mask 260.

The alignment mechanism 314 may receive instructions according to images captured by the alignment system 216 to move the substrate 252 in one or more of an X, Z, or θ direction to align the mask 260 with the substrate 252. Further, the alignment mechanism 314 may move the carrier 250 and the substrate 252 in a Z (e.g., vertical) direction away from the base 316 and toward the transfer robot 214 to engage with and receive the mask 260 and in a Z direction toward the base and away from the transfer robot 214 to disengage the mask 260 from the carrier 250 and the substrate 252.

With further reference to FIG. 2, the alignment system 216 is configured to aid in the alignment of the mask 260 with the substrate 252 and/or carrier 250. The alignment system 216 may include one or more cameras 217 configured to capture images of the mask 260, the carrier 250 and/or the substrate 252. The alignment system 216 may have a depth of focus of about 100 μm to about 150 μm. Alternatively, the alignment system 216 may have a depth of focus of less than 100 μm or greater than 150 μm. The cameras 217 may be configured to acquire one or more images of the mask 260, carrier 250 and the substrate 252. The images may be analyzed to determine a difference in alignment between the mask 260 and the substrate 252. Analyzing the images may include comparing the position of one or more alignment elements (e.g., fiducial markers) of the mask 260 with corresponding alignment elements (e.g., fiducial markers) of the substrate 252 or the carrier 250. For example, the alignment elements of the masks may be holes and the alignment elements of the substrate may be any type of marking that is viewable through the holes of the masks. The holes within the masks may be any shape and/or size and may be positioned at specified locations on the masks. The locations may be known by the controller 270 and/or the alignment system 216. The cameras 217 may be configured to acquire an image of the alignment of the elements of the substrate 252 through alignment elements (e.g., holes) of the mask 260. The images may be provided to the controller 270 which determines the difference between the alignment elements on the mask 260 and the alignment elements of the substrate 252 or carrier 250. Further, the controller 270 determines the direction or directions and the amount to move the substrate 252 and carrier 250 to align the substrate 252 with the mask 260. For example, the controller 270 may determine the direction or directions and the amount to move the substrate 252 to align the alignment elements of the substrate 252 with a center of a respective one of the alignment elements (e.g., holes) of the mask 260. The direction and amount to move the substrate 252 is communicated to one or more of the actuators of the alignment mechanism 314 of the alignment stage 212 from the controller 270 as a set of instructions.

The transfer robot 214 is configured to transfer masks between the mask stockers 220, 230 and the alignment stage 212. The transfer robot 214 may be controlled by the controller 270. The transfer robot 214 may include blade 215 configured to support a mask, e.g., the mask 260, along parallel edges of the mask. For example, the blade 215 may include two or more fingers configured to grip along first and second parallel edges of the mask 260. The first and second parallel edges of the mask 260 may comprise portions that are substantially flat.

The transfer robot 214 may receive instructions from the controller 270 instructing the transfer robot 214 to access a first mask stocker, e.g., mask stocker 220, to acquire a mask, e.g., the mask 260, and position the mask 260 over the surface of the substrate 252 and carrier 250. Further, the transfer robot 214 may receive instructions from the controller 270 to remove the mask 260 from a position over the substrate 252 and the carrier 250 and transfer the mask 260 to one of the mask stockers 220, 230. The transfer robot 214 may also transfer masks between the mask stockers 220, 230. Further, the transfer robot 214 may be configured to position the mask 260 over the substrate 252 within a distance of about 0.5 mm of an aligned position between the mask 260 and the substrate 252. Alternatively, the transfer robot 214 may be configured to position the mask 260 over the substrate 252 within a distance that is less than or greater than about 0.5 mm of an aligned position between the mask 260 and the substrate 252.

The transfer robot 214 may hold the mask 260 in a stationary position over the alignment stage 212. The transfer robot 214 may hold the mask 260 in a stationary position as determined by the alignment system 216. Further, the transfer robot 214 may hold the mask 260 in a stationary position while the alignment stage 212 is moved based on images acquired by the alignment system 216 to align the substrate 252 with the mask 260.

Figure 4:
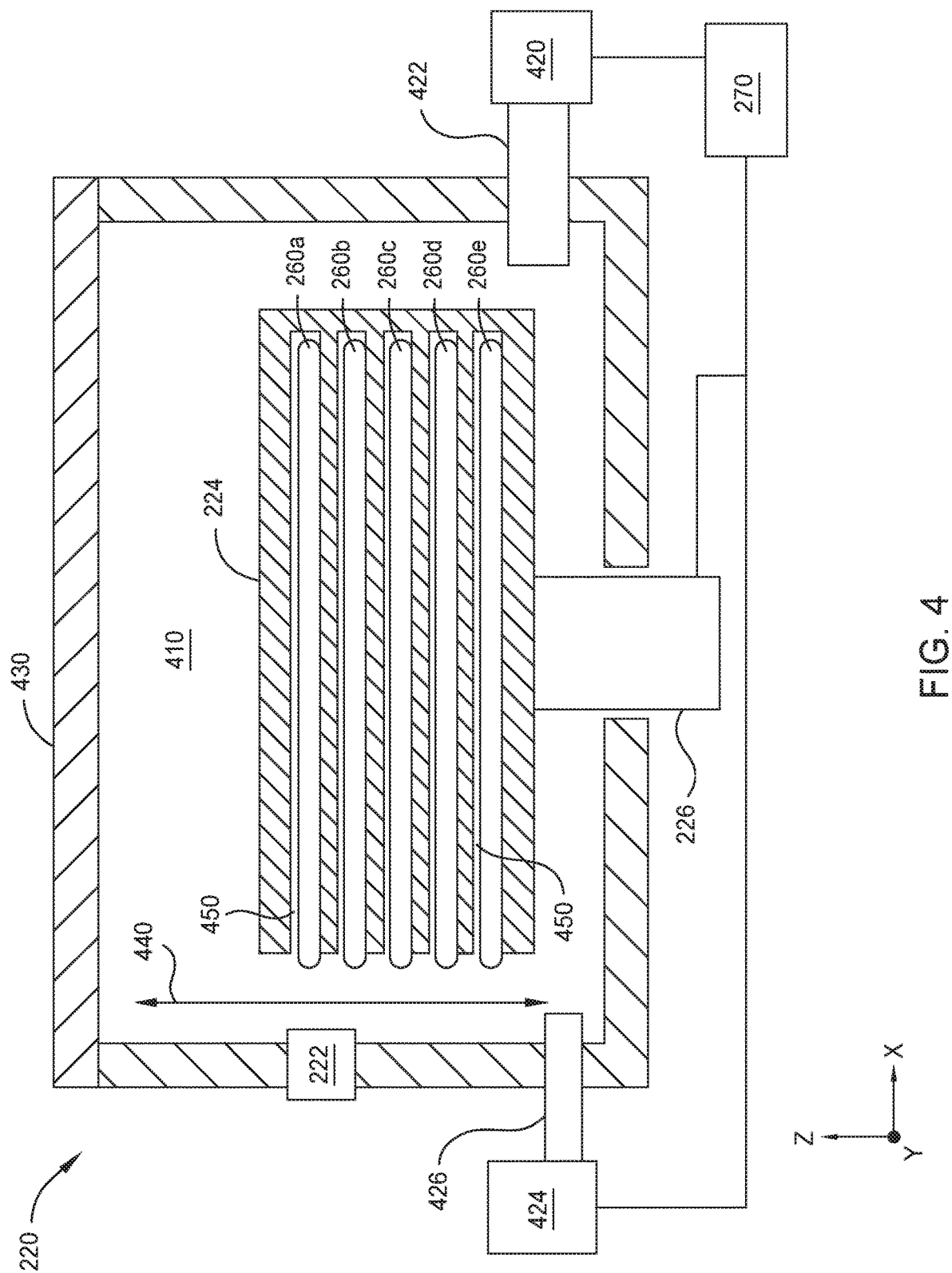
FIG. 4 is a schematic illustration of a cross-section of a mask stocker, according to one or more embodiments.

The mask stocker 220 includes a valve assembly 222, which is similar to the valve assembly 218, to isolate the interior volume of the mask stocker 220 from the interior volume of the alignment chamber 210. Further, as shown in FIG. 4, the mask stocker 220 houses a mask cassette 224. A vertical actuator 226 is configured to move the mask cassette 224 in a vertical direction to align a selected mask with the valve assembly 222 such that it may be accessed by the transfer robot 214. Further, the vertical actuator 226 may move the mask cassette 224 in a vertical direction to align an empty slot of the mask cassette 224 with the valve assembly 222 such that a mask may be transferred to the mask cassette 224 by the transfer robot 214.

The mask stocker 230 may be configured similarly to that of mask stocker 220. For example, the mask stocker 230 may include a valve assembly 232, a mask cassette 234 and a vertical actuator 236, each configured similarly to that of the valve assembly 222, the mask cassette 224 and the vertical actuator 226, respectively.

Both of the mask stockers 220 and 230 may house a plurality of masks which may be used during a deposition process. Further, the mask stocker 220 may house masks of a first type and the mask stocker 230 may house masks of a second type. For example, the mask stocker 220 may house masks utilized during the deposition of organic materials and the mask stocker 230 may house masks utilized during the deposition of metal layers. Additionally, or alternatively, at least one of the mask stockers 220 and 230 may house masks of various types. For example, at least one of the mask stockers 220 and 230 may house masks of a first type corresponding to the deposition of organic materials and masks of a second type corresponding to the deposition of metal layers. Further, the mask stocker 220 and/or the mask stocker 230 may house masks of a third type. At least one of the mask stockers 220 and 230 may house a number of masks of a first type and a number of masks of a second type. The number of masks of the first type may be equal to, less than or greater than the number of masks of the second type. Further, the mask stocker 220 may be controlled independently from the mask stocker 230.

Alternatively, the mask stocker 220 may house one or more masks which may be used during a deposition process, and the mask stocker 230 may house one or more masks to be cleaned. For example, the transfer robot 214 may move masks that have been identified as being ready to be cleaned from the mask stocker 220 to the mask stocker 230 or from the alignment stage 212 to the mask stocker 230.

The mask stocker 220 and the mask stocker 230 may maintain isolation between each other and the alignment chamber 210 of the alignment module 140 and between corresponding masks and an ambient environment. Isolating the masks from the ambient environment aids in the prevention of oxidation and moisture absorption on the masks. Further, as each of the mask stockers 220, 230 are isolated from each other and from the alignment chamber 210, each of the mask stockers 220, 230 may be operated independently. For example, one or more of the mask stockers 220, 230 may be vented while operation of the alignment module 140 and the processing platform 160 may be continued. A mask stocker 220, 230 may be vented to allow access to the corresponding mask cassette and masks. Further, when a mask cassette, e.g., the mask cassette 224, is placed within a mask stocker, e.g., mask stocker 220, 230, the mask stocker is pumped down to a vacuum by a vacuum pump, e.g., the vacuum pump 420. After the mask stocker is pumped down, the corresponding valve assembly, e.g., valve assembly 222, 232, may be opened to connect the mask stocker to the alignment chamber for processing.

FIG. 4 illustrates a cross-sectional view of the mask stocker 220, according to one or more embodiments. The mask stocker 220 includes an interior volume 410 in which the mask cassette 224 may be positioned. The mask cassette 224 is coupled to vertical actuator 226, and the vertical actuator 226 is configured to move the mask cassette 224 along path 440 to align a selected one of the masks 260a-260d or slots 450 with the valve assembly 222. As illustrated in FIG. 4, the mask cassette 224 is configured to hold 5 masks, e.g., the masks 260a-260d. Alternatively, the mask cassette 224 may be configured to hold less than 5 masks or more than 5 masks. The mask stocker 220 may also include a lid 430 which may be opened to gain access to the interior volume 410. For example, the lid 430 may be opened to remove the mask cassette 224 and/or one or more masks 260 from the mask stocker 220. Further, the lid 430 may be opened such that a mask cassette 224 may be loaded into the mask stocker 220. The vertical actuator 226 may move the mask cassette 224 to an unloading position when the lid 430 is opened to allow the mask cassette 224 to be removed from the mask stocker 220. Placing the mask cassette 224 into an unloading position may comprise moving the mask cassette 224 in a vertical direction toward the lid 430. Further, the vertical actuator 226 may be positioned into a loading position to receive the mask cassette 224 when the lid 430 is opened to receive a mask cassette 224 to be loaded into the mask stocker 220. The vertical actuator 226 lowers the mask cassette 224 into the interior volume 410 and the lid 430 may be closed.

The mask stocker 220 may also include gas supply source 424 that is configured to provide one or more gases to the interior volume 410 via gas inlet 426. The gas supply source 424 may be configured to pump one or more gases into the interior volume 410 to increase the pressure of the interior volume. Additionally, the mask stocker 220 may include a vacuum pump 420 and a gas outlet 422. The vacuum pump 420 may be configured to remove gas from the interior volume 410 to reduce the pressure of the interior volume 410. For example, the vacuum pump 420 may exhaust one or more gases from the interior volume 410 to place the interior volume 410 at or near vacuum.

The controller 270 may be electrically coupled to the vertical actuator 226, the gas supply source 424 and the vacuum pump 420. Further, the controller 270 may control the vertical actuator 226 to move the mask cassette 224 along the path 440, the gas supply source 424 to input a gas into the interior volume 410, and/or the vacuum pump 420 to remove gas from the interior volume 410. For example, the controller 270 may include a scheduler configured to control the vertical actuator 226. The scheduler may instruct the vertical actuator 226 to the move the mask cassette 224 along path 440 to align a selected mask to be transferred out of the mask stocker 230. A mask may be selected based on next deposition process for the substrate 252. For example, the scheduler of the controller 270 may have information corresponding to the entire deposition process and select masks according to the deposition process. Additionally, the controller 270 may be configured similar to that of the controller 150 or form part of the controller 150.

Figure 5:
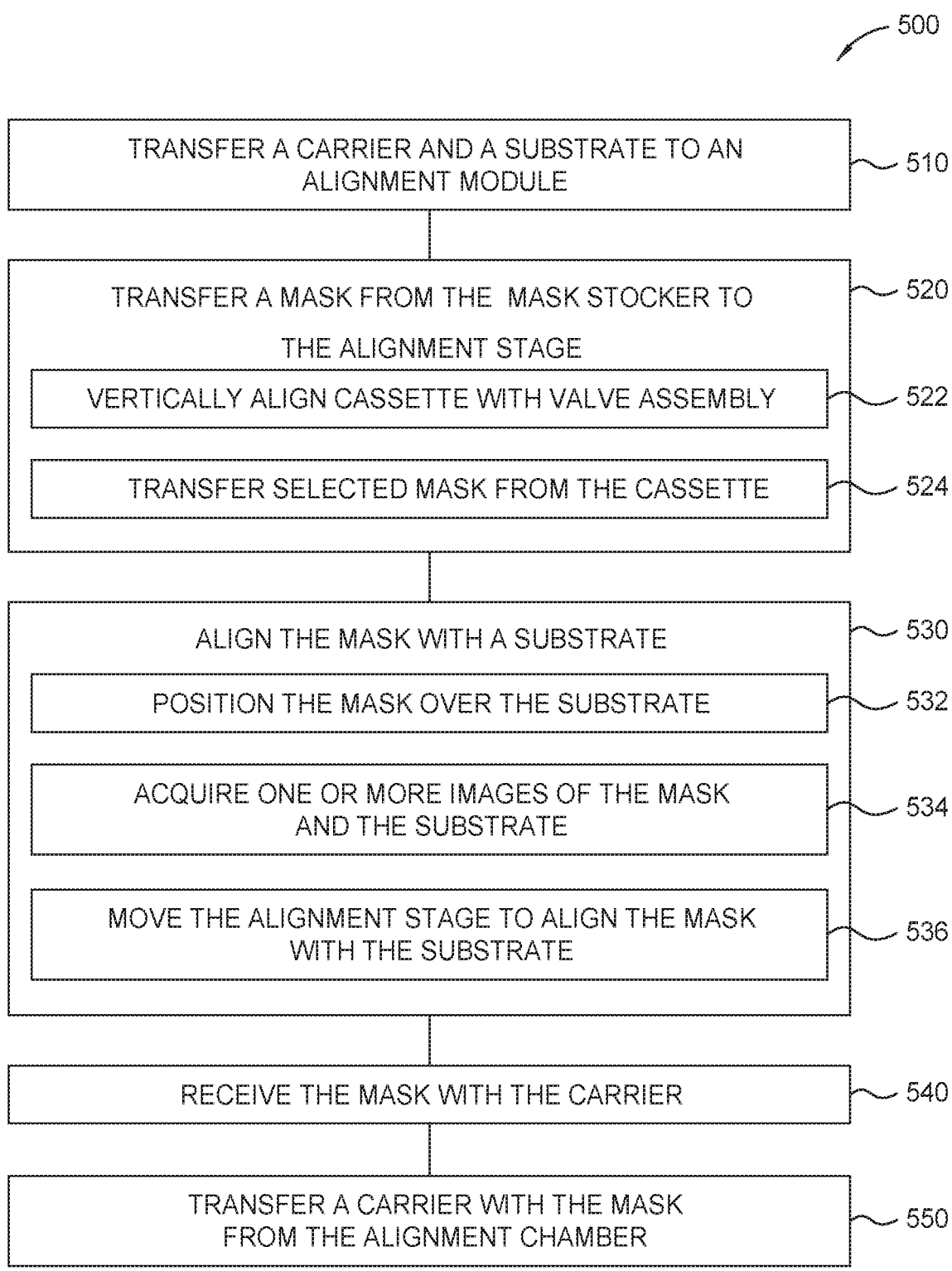
FIG. 5 illustrates a flow chart of a method for positioning a mask over a substrate, according to one or more embodiments.

FIG. 5 illustrates a flow chart of a method 500 for loading a mask on a carrier, according to one or more embodiments. At operation 510, a carrier 250 carrying a substrate 252 is transferred to an alignment module 140. For example, the transfer robot 131 transfers the carrier 250 and the substrate 252 to the alignment module 140. The transfer robot 131 may transfer the carrier 250 and the substrate 252 from one of the pass through chambers 122, 124 or one of the process chambers 132, 134, 136 and 138. The transfer robot 131 may pass the carrier 250 and the substrate 252 through the valve assembly 218 into the alignment module 140. Further, the carrier 250 may be positioned on the loading pins 310 of the alignment stage 212 and lowered into position on the alignment surface 312 by the alignment mechanism 314.

At operation 520, a mask is transferred from a mask stocker to the alignment stage. For example, the controller 270 may instruct the transfer robot 214 to transfer the mask 260 from the mask stocker 220 or the mask stocker 230 to the alignment stage 212 and position the mask 260 over the substrate 252. Further, during this operation, a mask cassette is vertically moved to align a selected mask with a valve assembly of the mask stocker (operation 522). For example, the controller 270 may instruct the vertical actuator 226 to move the mask cassette 224 vertically along the path 440 to align a selected one of the masks 260 with the valve assembly 222. At operation 524, a transfer robot transfers a selected mask from a mask cassette. For example, the controller 270 may instruct the transfer robot 214 to access the mask cassette 224 of the mask stocker 220 and transfer a selected mask from the mask cassette 224 to the blade 215. During this operation, the blade 215 of the transfer robot 214 is inserted along the edges of a selected mask, e.g., the mask 260b, and the transfer robot 214 removes the selected mask from the mask stocker 220 through the valve assembly 222.

At operation 530, the mask is aligned with a substrate and carrier. For example, the mask 260 may be aligned with the substrate 252 and carrier 250. Aligning the mask with the substrate may include positioning the mask over the substrate 252 and carrier 250 (operation 532). For example, the controller 270 may instruct the transfer robot 214 to position the mask 260 over the substrate 252 and carrier 250. Further, aligning the mask with the substrate may include acquiring one or more images of the mask, carrier and/or the substrate (operation 534). For example, the controller 270 may instruct the alignment system 216 to acquire one or more images of the mask 260, and the substrate 252. Each of the images may include a view of at least a portion of the substrate 252 through at least a portion of the mask 260. The images may be processed by the controller 270 to determine a difference in alignment between the substrate 252, carrier 250 and/or the mask 260. For example, the controller 270 may determine a distance between an alignment element on the mask 260 and a corresponding alignment element on the substrate 252. The distance may correspond to a distance between a center of an alignment element (e.g., hole) of the mask 260 and a respective alignment element on the substrate 252.

At operation 536, the alignment stage is moved to align a mask with the substrate and/or carrier. For example, the controller 270 may instruct the alignment mechanism 314 of the alignment stage 212 to move the alignment surface 312 in one or more of an X, Y, Z or θ direction to align the alignment elements on the mask 260 with the alignment elements on the substrate 252. The controller 270 may instruct the alignment stage to move in one or more of an X, Y, or Z or θ direction based on the distance between the alignment element on the mask 260 and a corresponding alignment element on the substrate 252. For example, moving the alignment stage 212 in one or more of the X, Y, Z, or θ direction aligns the alignment element on the mask 260 with a corresponding alignment element on the substrate 252. Moving the substrate 252 to align alignment elements of the mask 260 with alignment elements of the substrate 252 may include moving the substrate 252 to position each of the alignment elements of the substrate 252 within a center of a respective one of the alignment elements (e.g., holes) mask 260.

Further, the alignment system 216 may acquire one or more additional images of the mask 260 and the substrate 252 after the alignment stage has been moved to determine if additional adjustments may be needed to align the mask 260 with the substrate 252. For example, the controller 270 may instruct the alignment system 216 to acquire one or more additional images and process those images to determine how much to move the alignment stage 212 in one or more of the X, Y, Z, or θ directions.

At operation 540, a mask is received up by a carrier. For example, the mask 260 is received by the carrier 250 after the mask 260 has been aligned with the substrate 252. The controller 270 may instruct the alignment stage 212 to move vertically until the carrier 250 contacts the mask 260. As the diameter of the carrier 250 and/or the substrate 252 is less than the diameter of the mask 260, and the blade 215 of the transfer robot 214 resides outside the perimeter of the carrier 250 and/or the substrate. Further, as the carrier 250 and the substrate 252 move vertically toward the mask 260, the carrier contacts the mask 260 without the substrate 252 being interfered with by the blade 215 of the transfer robot 214.

At operation 550, the carrier supporting the substrate and the mask is transferred from the alignment module 140. For example, the transfer robot 131 may access the alignment module 140 via the valve assembly 218 to pick up the carrier 250 supporting the substrate 252, and the mask 260. The controller 270 may instruct the valve assembly 218 to open and the controller 150 may instruct the transfer robot 131 to access the alignment module 140 and transfer the carrier 250, the substrate 252 and the mask 260 out of the alignment module 140. The loading pins 310 lift the carrier 250 holding the substrate 252 and the mask 260 away from the alignment surface 312 of the alignment stage 212, placing the carrier 250 into the unloading position such that it may be accessed by the transfer robot 131. The transfer robot 131 picks up the carrier 250 once it has been positioned in the unloading position by the loading pins 310 and transfers the carrier 250, the substrate 252 and the mask 260 out of the alignment chamber.

Figure 6:
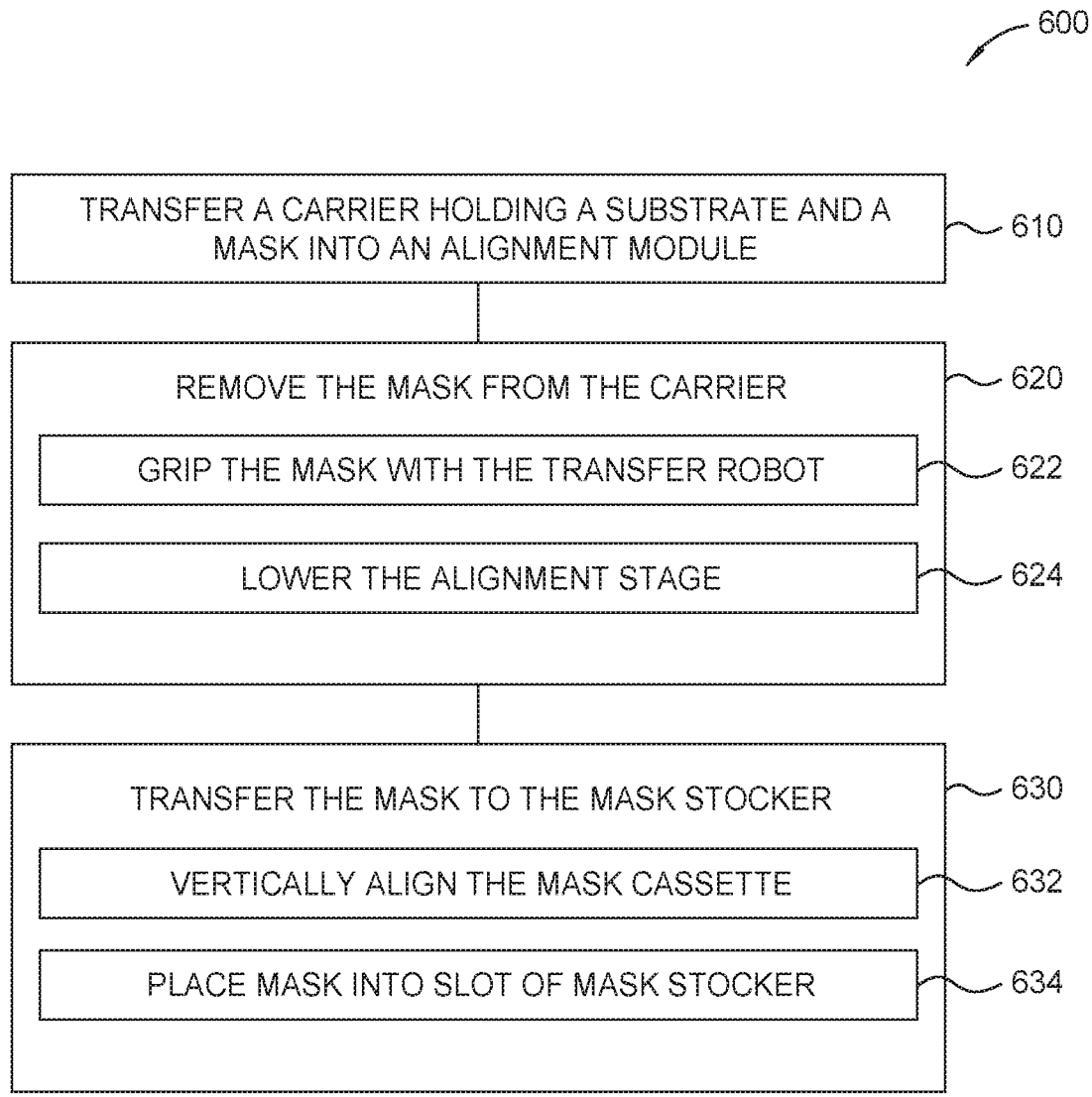
FIG. 6 illustrates a flow chart of a method for removing a mask from a substrate, according to one or more embodiments.

FIG. 6 illustrates a flow chart of a method 600 for removing a mask from a carrier, according to one or more embodiments. At operation 610, a carrier 250 carrying the substrate 252, and the mask 260 is transferred into the alignment module 140. Further, the controller 270 may instruct the alignment stage 212 to move the loading pins 310 away from the alignment surface 312 such that they are positioned into the loading position. The controller 150 may instruct the transfer robot 131 to transfer the carrier 250, the substrate 252 and the mask 260 through the valve assembly 218 and onto the loading pins 310. After the carrier 250 is placed on the loading pins 310, the controller 270 may instruct the alignment stage 212 to move the loading pins 310 toward the alignment surface 312 until the carrier 250 is supported by the alignment surface 312. At operation 620, the mask is removed from the carrier. For example, the controller 270 may instruct the transfer robot 214 to position the blade 215 along the edges of the mask 260 (operation 622) such that the mask is at least partially supported by the transfer robot 214. At operation 624 the alignment stage is lowered disengaging the carrier from the mask. For example, the controller 270 may instruct the alignment stage 212 to move vertically away from the transfer robot 214, and as the alignment stage 212 is lowered the mask 260 is held and supported by the transfer robot 214.

At operation 630, the mask is transferred to a mask stocker. For example, the controller 270 instructs the transfer robot 214 to transfer the mask 260 to one of the mask stocker 220 and 230. At operation 632, an open slot in a mask cassette is vertically aligned with a valve assembly. For example, the vertical actuator 226 is instructed by the controller 270 to move the mask cassette 224 along path 440 to align an open slot 450 of the mask cassette 224 with the valve assembly 222. At operation 634, the transfer robot 214 transfers the mask 260 into the open slot 450. For example, the controller 270 may instruct the valve assembly 222 to open and the transfer robot 214 to transfer the mask 260 through the valve assembly 222 into the open slot of the mask cassette 224.

Figure 7:
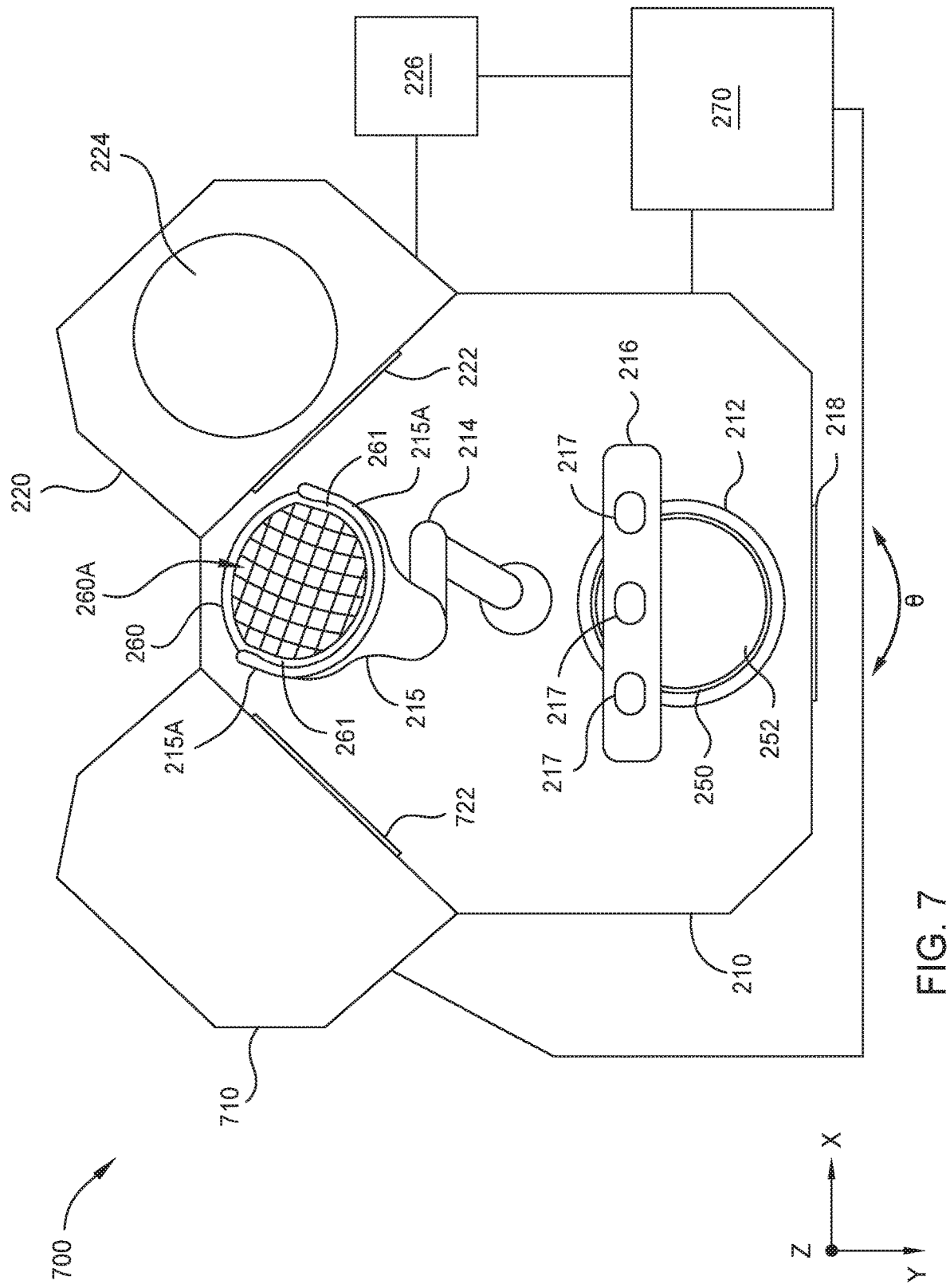
FIG. 7 is a schematic illustration of an alignment stage, according to one or more embodiments.

FIG. 7 illustrates an alignment module 700, according to one or more embodiments. The alignment module 700 is configured similar to that of the alignment module 140; however, the alignment module 700 includes a cleaning chamber 710 where the alignment module 140 includes the mask stocker 230. The cleaning chamber 710 may be configured to clean one or more masks to remove material buildup from the masks. The cleaning chamber 710 includes a valve assembly 722 configured to isolate the interior volume of the cleaning chamber 710 from the alignment chamber 210.

During the various deposition processes utilized to deposit the one or more layers of organic or metal films on a substrate, the masks experience a buildup of organic or metal materials. Overtime the buildup of organic or metal material begins to hinder the ability of the mask to be used during the deposition process and the masks may become unusable if they are not cleaned to remove the deposited material. However, removing the masks from the mask stocker 220 for cleaning is time intensive and may cause damage while the masks are handled and moved to another chamber to be cleaned. Thus, by the cleaning of the masks within the alignment module 700, the lifetime usefulness of the masks is increased and the possibility that the masks are damaged during cleaning is reduced. Further, cleaning the masks within the alignment module 700 reduces down time of the alignment module 700, as the alignment module 700 does not need to be taken off-line to remove the masks for cleaning.

Figure 8A:
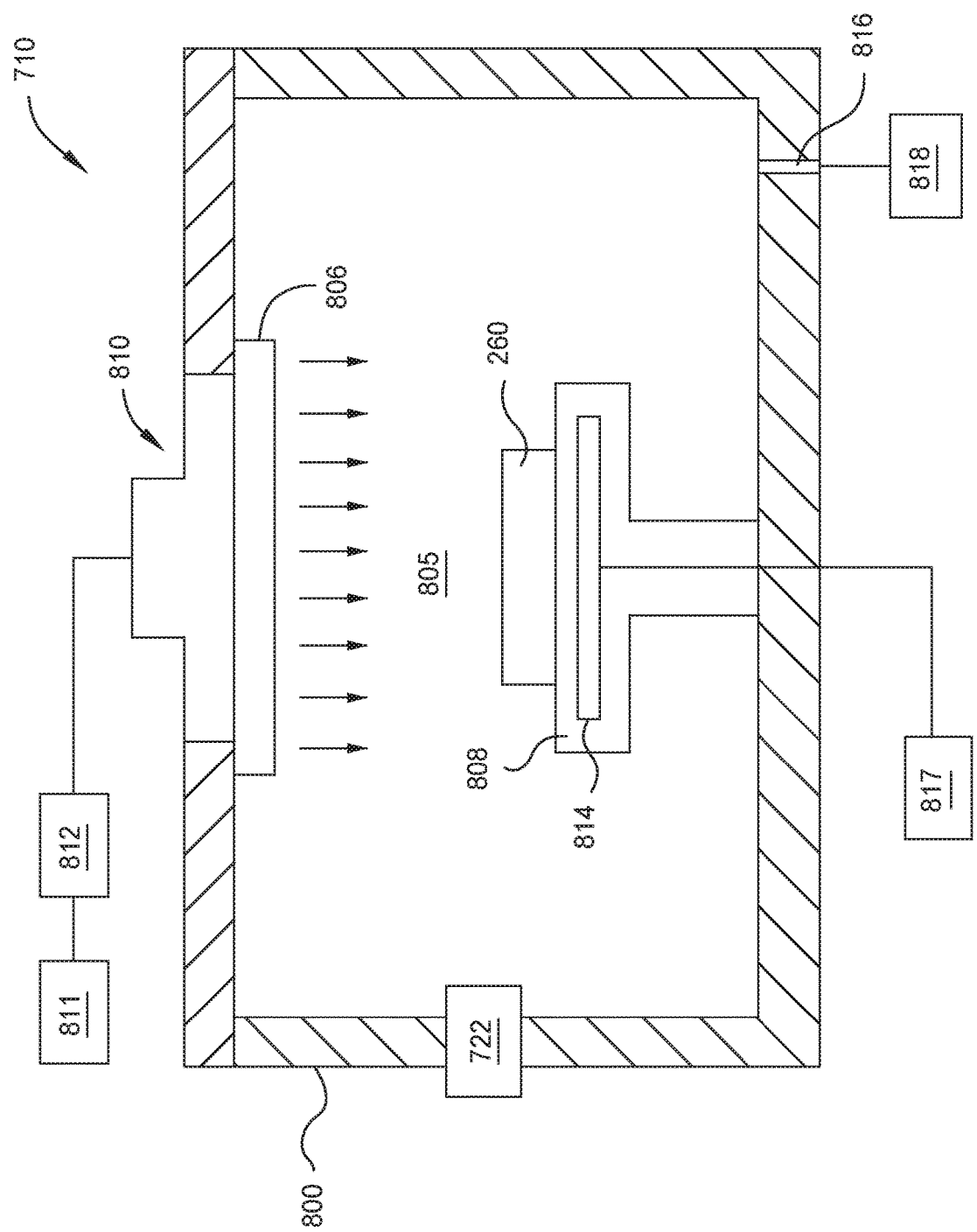
FIGS. 8A and 8B are schematic illustrations of a cleaning chamber, according to one or more embodiments.

FIG. 8A is a schematic illustration of a cross-section of the cleaning chamber 710, according to one implementation of the present disclosure. The cleaning chamber 710 includes a chamber body 800 having a support pedestal 808 for supporting masks 260 thereon. Additionally, the cleaning chamber 710 includes a lid assembly 810 configured to introduce cleaning gases (e.g., chemistries) into a processing volume 805 of the chamber body 800. For example, the lid assembly 810 may be coupled to a gas supply source 811 that provides the cleaning gases to the lid assembly 810. The gas supply source 811 may include a remote plasma source (RPS) 812 configured to generate a plasma and flow the generated plasma into the chamber body 800 or any other type of gas supply source.

The lid assembly 810 includes a showerhead 806 that introduces gases into the processing volume 805. The cleaning gases, such as oxygen containing gases (e.g., $O_2$), halogen containing gases (e.g., $Br_2$, $HCl$, $Cl_2$), or fluorine containing gases (e.g., $NF_3$, $F_2$), introduced into the processing volume 805 react on or above the mask 260 for the purposes of removing material from the mask 260. For example, a plasma may be created in the processing volume 805 to facilitate removal of material from the mask 260. The chamber body 800 may include one or more power supplies 817 that propagate radio frequency (RF) energy, direct current (DC) voltage, and/or alternating current (AC) throughout the substrate processing chamber 804 and/or components thereof. For example, the one or more power supplies 817 may drive the biasing electrode 814 with an RF signal to generate the plasma within the processing volume 805. Additionally, or alternatively, the one or more power supplies 817 may drive the showerhead 824 with an RF signal to generate the plasma within the processing volume 805.

Further, the chamber body 800 may include one or more heaters and/or one or more cooling channels, such as in the support pedestal 808, that control the temperatures of various components and aspects of the substrate processing chamber 804.

Additionally, the chamber body 800 includes an exhaust opening 816 which is fluidly connected to a vacuum pump 818. The vacuum pump 818 is configured to exhaust gases from the processing volume 805 through the exhaust opening 816. Further, the chamber body 800 includes the valve assembly 722 through which the mask 260 is inserted into the chamber body 800 and removed from the chamber body 800.

Figure 8B:
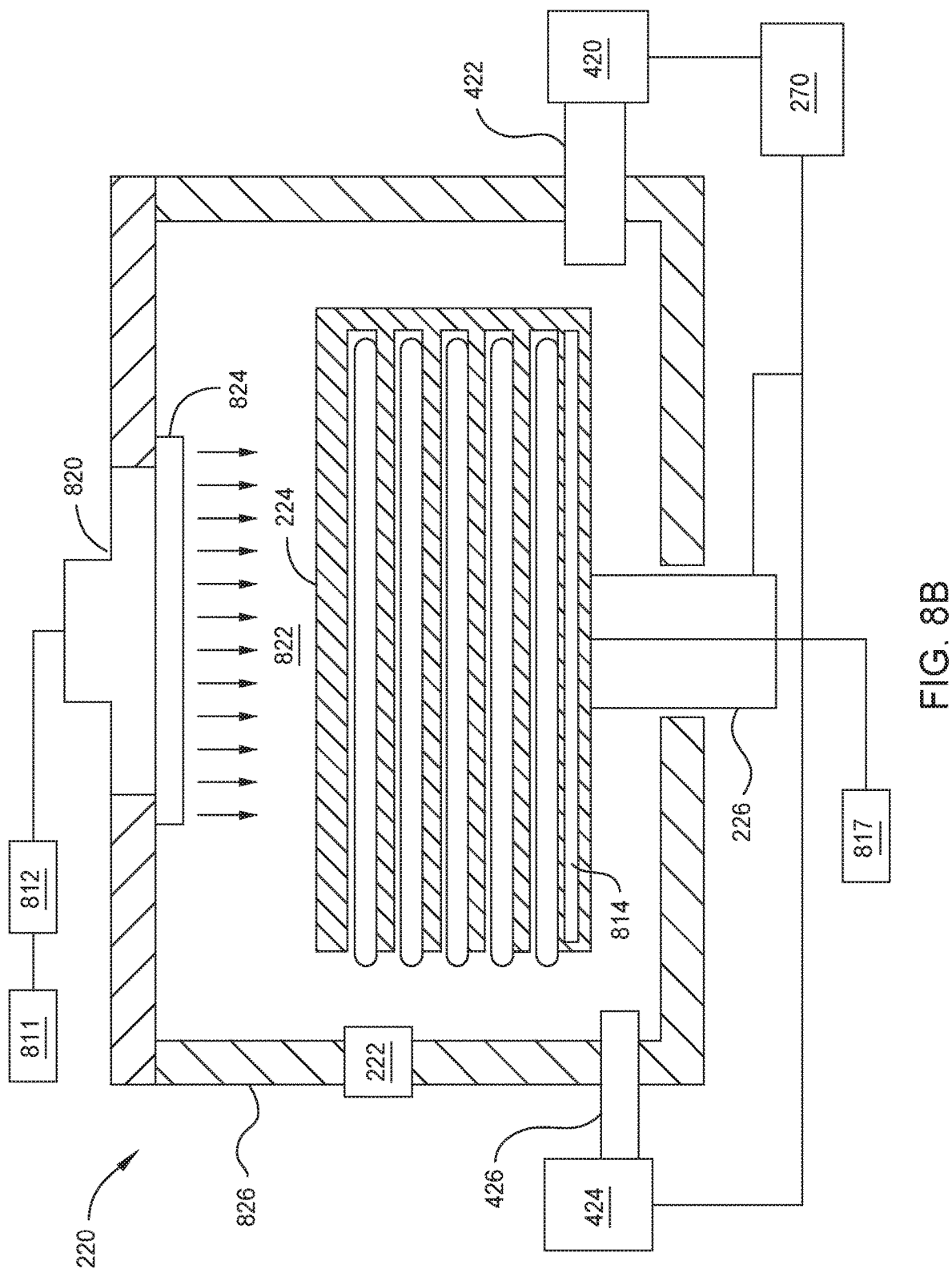

Additionally, or alternatively, a mask stocker may be configured for both mask storage and mask cleaning. For example, one or more of the mask stockers 220 and 230 may be configured similar to that of the cleaning chamber 710. For example, one or more of the mask stockers 220 and 230 may be configured to act as both a storage location for masks and also as a cleaning chamber to clean the masks. FIG. 8B illustrates the mask stocker 220 configured for both mask storage and mask cleaning. The mask stocker 220 includes the lid assembly 820 which is coupled to the gas supply source 811 that provides the cleaning gases to the lid assembly 820. The gas supply source 811 may include RPS 812 configured to generate a plasma and flow the generated plasma into the processing volume 822 or any other type of gas supply source.

The lid assembly 820 is configured similar to that of the lid assembly 810 of FIG. 8A. For example, the lid assembly 820 includes a showerhead 824 that introduces gases into the processing volume 822. Further, a plasma may be created in the processing volume 822 to facilitate removal of material from one or more masks 260. To generate the plasma, one or more power supplies 817 may be utilized to propagate RF energy, DC voltage, and/or AC throughout the substrate processing chamber 826 and/or components thereof. For example, the one or more power supplies 817 may drive the biasing electrode 814 with an RF signal to generate the plasma within the processing volume 805. The biasing electrode 814 may be positioned anywhere within the mask cassette 224. Further, more than one biasing electrode 814 may be included with the mask cassette 224. Each of the biasing electrodes 814 may be simultaneously driven by the one or more power supplies 817. Alternatively, a first one or more of the biasing electrodes 814 may be driven during a first period, and a second one or more of the biasing electrodes 814 may be driven during a second period that is non-overlapping with the first period. Additionally, or alternatively, the one or more power supplies 817 may drive the showerhead 824 with an RF signal to generate the plasma within the processing volume 805. Further, the vacuum pump 420 may exhaust gases from the processing volume 822 via gas outlet 422. Additionally, the gas supply source 424 and gas inlet 426 may be omitted in embodiments where the mask stocker 220 is configured for both mask storage and mask cleaning.

Figure 9:
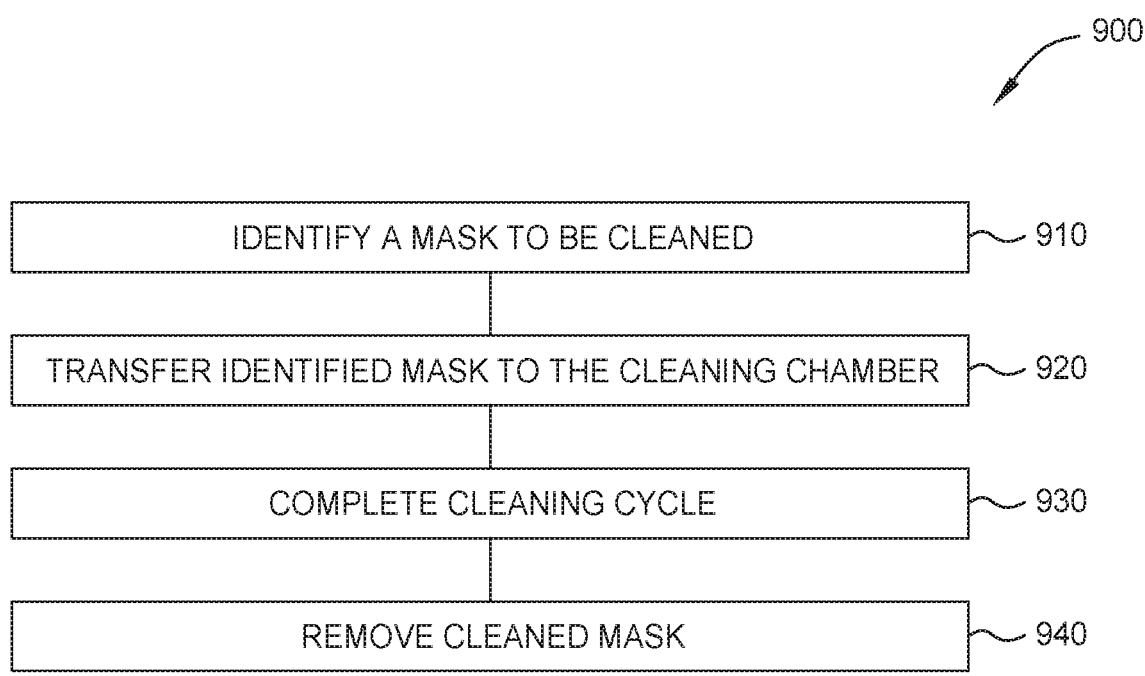
FIG. 9 illustrates a flow chart of a method for cleaning a mask, according to one or more embodiments.

FIG. 9 illustrates an example flowchart of method 900 for cleaning a mask, according to one or more embodiments. At operation 910, a mask to be cleaned is identified. For example, the controller 270 may determine that a mask, e.g., mask 260, is ready to be cleaned based on one or more parameters. The one or more parameters may include the type of deposition for which the mask is utilized, a threshold number of deposition processes performed using the mask and/or a period of time between one or more deposition steps. The threshold number of deposition processes may include one or more deposition processes. The controller 270 may identify that a mask should be cleaned in response to the mask undergoing (e.g., exceeding) a threshold number of deposition cycles. The controller 270 may track the number of deposition cycles each mask undergoes, and triggers a cleaning cycle in response to the deposition cycles for a corresponding mask. Further, masks utilized during the deposition of different materials may experience different amounts and/or rates of buildup of deposition material. For example, masks utilized during the deposition of organic materials may experience buildup faster and require more frequent cleanings than masks utilized during the deposition of metal materials. Accordingly, a determination that a second mask should be cleaned may be based on second one or more parameters that are different than the first one or more parameters. For example, the second one or more parameters may correspond to a deposition processes that is different than that of the first one or more parameters, and a second threshold number of deposition processes that differs from the first threshold number. The second threshold number may be greater than or less than the first threshold number. Further, the first deposition process may correspond to the deposition of organic layers and the second deposition process may correspond to the deposition of metal layers.

At operation 920, a mask identified to be cleaned is transferred to the cleaning chamber. For example, the controller 270 may instruct the transfer robot 214 to transfer a mask from the alignment stage 212 after the completion of a deposition cycle or from the mask stocker 230. The transfer robot 214 may transfer the mask through the valve assembly 722 and position the mask on the support pedestal 808.

At operation 930, a cleaning cycle is completed. After the transfer robot 214 has positioned the mask 260 on the support pedestal 808 and is removed from the processing volume 805, the controller 270 instructs the valve assembly 722 to isolate the processing volume 805 from the alignment chamber 210 and a cleaning cycle may be completed. For example, the controller 270 may instruct the gas supply source 811 to flow one or more cleaning gases into the processing volume 805 through the lid assembly 810 and the showerhead 806. Further, the controller 270 may instruct the power supply 817 to drive the biasing electrode 814 with an RF signal to ignite the cleaning gas to generate a plasma containing the cleaning gas. At the completion of the cleaning cycle, the controller 270 instructs the power supply 817 to cease driving the biasing electrode 814 with the RF signal, and any remaining cleaning gases are removed from the processing volume 805 via the vacuum pump 818.

At operation 940, the cleaned mask is removed from the cleaning chamber. For example, the controller 270 may instruct the valve assembly 722 to open and the transfer robot 214 to transfer the cleaned mask 260 from the cleaning chamber 710. The cleaned mask may be transferred to the mask stocker 220 or transferred to the alignment stage 212 to be loaded onto a carrier and utilized during deposition.

While the foregoing is directed to embodiments of the present disclosure, other and further embodiments of the disclosure may be devised without departing from the basic scope thereof, and the scope thereof is determined by the claims that follow.

What is claimed is:

1. An alignment module comprising:
a mask stocker configured to house a mask cassette configured to store a plurality of masks, the mask stocker comprising a first valve assembly;
a cleaning chamber configured to clean a mask of the plurality of masks, the cleaning chamber comprising a second valve assembly;
an alignment chamber coupled to the mask stocker via the first valve assembly and the cleaning chamber via the second valve assembly, the alignment chamber comprising:
an alignment stage configured to support a carrier and a substrate; and
a transfer robot configured to transfer the mask to the cleaning chamber from one or more of the alignment stage and the mask stocker; and
an alignment system comprising one or more cameras, the alignment system configured to:
acquire one or more images of the mask and the substrate, the mask comprising first alignment elements and the substrate comprising second alignment elements; and
position, based on the one or more images, the second alignment elements within the first alignment elements to align the mask with the substrate.

2. The alignment module of claim 1, wherein the cleaning chamber comprises:
a chamber body;
a support pedestal positioned within the chamber body and configured to support the mask; and
a lid assembly configured to introduce one or more cleaning gases into the chamber body.

3. The alignment module of claim 2, wherein the support pedestal of the cleaning chamber comprises a biasing electrode coupled to a power supply, and wherein the power supply is configured to drive the biasing electrode with a radio frequency (RF) signal to generate a plasma in the chamber body.

4. The alignment module of claim 1, further comprising a controller configured to instruct the transfer robot to transfer the mask to the cleaning chamber.

5. The alignment module of claim 4, wherein the controller is further configured to instruct the transfer robot to transfer the mask from the cleaning chamber to the mask stocker.

6. The alignment module of claim 4, wherein the mask is transferred to the cleaning chamber based on at least one of a first type of deposition process and a first number of deposition cycles.

7. The alignment module of claim 6, wherein the first type of deposition process corresponds to one of organic film deposition and metal layer deposition.

8. The alignment module of claim 1, wherein the plurality of masks comprises a first type of masks corresponding to organic material deposition and a second type of masks corresponding to metal layer deposition.

9. An integrated platform for processing a substrate, the integrated platform comprising:
a transfer chamber comprising a substrate transfer robot;
a factory interface comprising:
a substrate carrier chamber configured to receive a substrate and chuck the substrate to a carrier; and
a factory interface transfer robot configured to transfer the substrate and the carrier from the factory interface to the transfer chamber; and
a plurality of processing chambers and an alignment module coupled to the transfer chamber, wherein the alignment module comprises:
a mask stocker configured to house a mask cassette configured to store a plurality of masks, the mask stocker comprising a first valve assembly;
a cleaning chamber configured to clean a mask of the plurality of masks, the cleaning chamber comprising a second valve assembly;
an alignment chamber coupled to the mask stocker via the first valve assembly and the cleaning chamber via the second valve assembly, the alignment chamber comprising:
an alignment stage configured to support the carrier and the substrate; and
a transfer robot configured to transfer the mask to the cleaning chamber from one or more of the alignment stage and the mask stocker; and
an alignment system comprising one or more cameras, the alignment system configured to:
acquire one or more images of the mask and the substrate, the mask comprising first alignment elements and the substrate comprising second alignment elements; and
position, based on the one or more images, the second alignment elements within the first alignment elements to align the mask with the substrate.

10. The integrated platform of claim 9, wherein the cleaning chamber comprises:
a chamber body;
a support pedestal positioned within the chamber body and configured to support the mask; and
a lid assembly configured to introduce one or more cleaning gases into the chamber body.

11. The integrated platform of claim 10, wherein the support pedestal of the cleaning chamber comprises a biasing electrode coupled to a power supply, and wherein the power supply is configured to drive the biasing electrode with a radio frequency (RF) signal to generate a plasma in the chamber body.

12. The integrated platform of claim 9, further comprising a controller configured to: instruct the transfer robot to transfer the mask to the cleaning chamber based on one or more parameters.

13. The integrated platform of claim 12, wherein the one or more parameters correspond to a first type of deposition process and a number of deposition cycles.

14. The integrated platform of the claim 13, wherein the controller configured to instruct the transfer robot to the transfer the mask to the cleaning chamber in response to the number of deposition cycles exceeding a threshold.

15. The integrated platform of claim 14, wherein the first type of deposition process corresponds to one of an organic film deposition and a metal layer deposition.

16. The alignment module of claim 1, wherein the first alignment elements are holes and the second alignment elements are markings viewable via the first alignment elements.

17. The alignment module of claim 1, wherein the alignment system is configured to move the alignment stage to align the first alignment elements with the second alignment elements.

18. The alignment module of claim 1, wherein the transfer robot is configured to transfer the mask to the cleaning chamber via the second valve assembly, and to transfer the mask to the mask stocker via the first valve assembly.

* * * * *